United States Patent
Fan et al.

(10) Patent No.: US 12,457,772 B2
(45) Date of Patent: Oct. 28, 2025

(54) REGENERATION ANNEAL OF METAL OXIDE THIN-FILM TRANSISTORS

(71) Applicant: Applied Materials, Inc., Santa Clara, CA (US)

(72) Inventors: Dejiu Fan, Santa Clara, CA (US); Yun-chu Tsai, San Jose, CA (US); Dong Kil Yim, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 612 days.

(21) Appl. No.: 17/664,335

(22) Filed: May 20, 2022

(65) Prior Publication Data

US 2023/0378368 A1 Nov. 23, 2023

(51) Int. Cl.
*H10D 30/67* (2025.01)
*H01L 21/324* (2006.01)
*H10D 30/01* (2025.01)

(52) U.S. Cl.
CPC ....... *H10D 30/6755* (2025.01); *H01L 21/324* (2013.01); *H10D 30/031* (2025.01); *H10D 30/6757* (2025.01)

(58) Field of Classification Search
CPC .............. H01L 29/78684; H01L 29/22; H01L 29/7869; H10D 30/6755; H10D 30/6741
See application file for complete search history.

(56) References Cited

U.S. PATENT DOCUMENTS

| | | | |
|---|---|---|---|
| 8,203,143 B2 | 6/2012 | Imai | |
| 2005/0275038 A1* | 12/2005 | Shih | H01L 29/7869 257/382 |
| 2009/0325341 A1 | 12/2009 | Itagaki et al. | |
| 2010/0133525 A1* | 6/2010 | Arai | H10D 30/6755 257/E29.296 |
| 2011/0175081 A1* | 7/2011 | Goyal | H01L 29/7869 257/43 |
| 2011/0180793 A1* | 7/2011 | Taniguchi | H01L 29/7869 257/E21.409 |
| 2012/0211745 A1* | 8/2012 | Ueda | H10D 30/6755 257/43 |
| 2013/0237013 A1 | 9/2013 | Yamazaki | |

(Continued)

OTHER PUBLICATIONS

International Opinion and Search Report dated Aug. 18, 2023 for Application No. PCT/US2023/020516.

(Continued)

*Primary Examiner* — Sue A Purvis
*Assistant Examiner* — Jason James Greaving
(74) *Attorney, Agent, or Firm* — Patterson + Sheridan, LLP

(57) ABSTRACT

A method of forming a TFT is provided including forming a buffer layer over a substrate. A metal oxide channel layer is formed over the buffer layer and the channel layer is annealed. A gate insulator layer is formed over the channel layer and an ILD is deposited over the gate insulator layer to form the TFT. The TFT is annealed for a first annealing condition to form an annealed TFT. The annealed TFT is shorted or includes a first threshold voltage of about 0 volt or less. The annealed TFT is annealed for a second annealing condition to form a regenerated TFT having a second threshold voltage greater than the first threshold voltage, the second annealing condition includes a temperature of about 150° C. to about 275° C.

15 Claims, 6 Drawing Sheets

(56) References Cited

U.S. PATENT DOCUMENTS

| | | |
|---|---|---|
| 2013/0260497 A1 | 10/2013 | Ahn et al. |
| 2013/0334530 A1 | 12/2013 | Katoh et al. |
| 2016/0307979 A1 | 10/2016 | Lee |
| 2018/0233594 A1* | 8/2018 | Imazawa ............. H01L 27/1255 |
| 2019/0393353 A1* | 12/2019 | Jeong ................ H01L 29/66969 |

OTHER PUBLICATIONS

Zhang et al., "Effects of Thermal Annealing on the Electrical Characteristics of In—Ga—Zn—O Thing-Film Transistors With Al2O3 Gate Dielectric" State Key Laboratory of ASIC and System, Schoof of Microelectronics, Fudan University, Shanghai 200433, People's Repbulic of China, Nov. 20, 20143.

Zhong et al., "Effects of Annealing Temperatur on Properties of InSnZnO Thin Film Transistors Prepared by Co-Sputtering", Royal Society of Chemistry, Oct. 10, 2018.

* cited by examiner

REGENERATION ANNEAL OF METAL OXIDE THIN-FILM TRANSISTORS

BACKGROUND

Field

Embodiments of the present disclosure generally relate to, thin film transistor (TFT) devices and methods for treating the devices for enhanced electrical performance and device stability.

Description of the Related Art

A thin film transistor (TFT) is formed by depositing thin films of an active semiconductor layer, a dielectric layer, and metallic contacts, over a supporting substrate, such as glass. In particular, a TFT can be a metal oxide semiconductor field effect transistor (MOSFET).

TFTs have gained significant interest in display applications due to their high resolution, low power consumption, and high speed operation for liquid crystal displays (LCDs) and organic light-emitting diode (OLED) displays. TFTs are embedded within a panel of the display. Data line voltage signals from source driver ICs in display module and scan line voltage signals from gate driver circuits in peripheral display panel area in the display panel are delivered to TFTs in pixel circuits to control display images by turning on and off the TFTs in active display panel area. Image distortion is decreased by improving the response of the TFT with higher mobility and/or by reducing crosstalk between pixels. Most display products including LCD or OLED televisions (TVs) and monitors include TFTs in the panel. Many modern high resolution and high-quality electronic visual display devices use active matrix based OLED displays with a large number of TFTs as components of pixel circuits. One beneficial aspect of TFT technology is its use of a separate TFT for each pixel on the display. Each TFT works as a switch or a source of current in the pixel circuit or gate driver circuit by controlling voltage and current through data and gate signal lines for increased control of display images. Higher on current from a high mobility TFT allows fast refresh of the display images and better image qualities by minimizing the distortion of data and gate signal voltages.

During fabrication of TFTs for certain devices, such as low temperature polycrystalline oxide (LTPO) displays, TFTs can be sensitive to integration processes causing poor uniformity, prohibitively high conductivity, or electrical shorting. Some techniques have been employed to enhance device performance; however, conventional techniques are often available only for certain integration processes and have other drawbacks.

Thus, there is a need for a method of fabricating stable TFTs that can be broadly deployed for a broad set of TFTs having different integration processes.

SUMMARY

In some embodiments, a method of forming a thin film transistor (TFT) is provided. The method includes forming a buffer layer over a substrate. A metal oxide channel layer is formed over the buffer layer. The method includes annealing the metal oxide channel layer after forming the metal oxide channel layer. A gate insulator layer is formed over the metal oxide channel layer. The method includes depositing an inter-layer dielectric (ILD) over the gate insulator layer to form the TFT. The method includes annealing the TFT for a first annealing condition to form an annealed TFT. The method includes annealing the annealed TFT for a second annealing condition to form a regenerated TFT having a second threshold voltage greater than the first threshold voltage, the second annealing condition comprising a temperature of about 150° C. to about 275° C.

In some embodiments, a method of forming a thin film transistor (TFT) is provided. The method includes forming a buffer layer over a substrate and forming a metal oxide channel layer over the buffer layer. The method includes annealing the metal oxide channel layer after forming the metal oxide channel layer at a temperature of about 140° C. to about 240° C. for about 5 minutes to about 30 minutes. A gate insulator layer is formed over metal oxide channel layer. The gate insulator layer is annealed. The method includes depositing an inter-layer dielectric (ILD) over the gate insulator layer and annealing the TFT for a first annealing condition to form an annealed TFT. The method includes annealing the annealed TFT for a second annealing condition in the presence of air to form a regenerated TFT having a second threshold voltage greater than the first threshold voltage. The second annealing condition includes annealing at a temperature of about 150° C. to about 275° C.

In some embodiments, a method is provided for processing a thin film transistor (TFT). The method includes providing the TFT comprising a silicon-containing buffer layer, a metal oxide channel layer, a gate insulator layer, and an inter-layer dielectric (ILD). The TFT is annealed for a first annealing condition to form an annealed TFT. The annealed TFT is annealed for a second annealing condition to form a regenerated TFT. The second annealing condition includes a temperature of about 150° C. to about 275° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally provide TFT device structures and methods of forming the TFT structures having enhanced electrical performance and stability for display devices. In particular, top gate TFT devices are sensitive to conventional integration processes. Small process variations of operating parameters can cause considerable non-uniformity of films deposited over substrate. Forming low temperature polysilicon oxide (LTPO) includes forming an inter-layer dielectric and annealing the inter-layer dielectric. Annealing the TFT can cause the TFT to electrically short or increase conductivity to a value that renders the TFT unusable for the intended application of the TFT. Conventional methods of addressing, preventing, or overcoming TFT shorting issues have been integration specific, such as modifying film properties of certain individual layers to achieve uniform and acceptably stable final TFT performance.

In contrast, the methods described herein provide processes for regenerating shorted or highly conductive TFTs to TFTs that are usable for LTPO products. The regeneration treatment recovers the voltage threshold of shorted or highly conductive TFTs independent of process by which the TFT is integrated. Moreover, the entire TFT is treated in the process described herein without adjusting individual layers. The regeneration treatment includes annealing the TFT at a temperature of about 275° C. or less, such as about 200° C. to about 250° C. for 30 minutes to 12 hours, such as about 60 minutes to about 120 minutes.

Gate Insulator Layer Cut Integration

Figure 1:
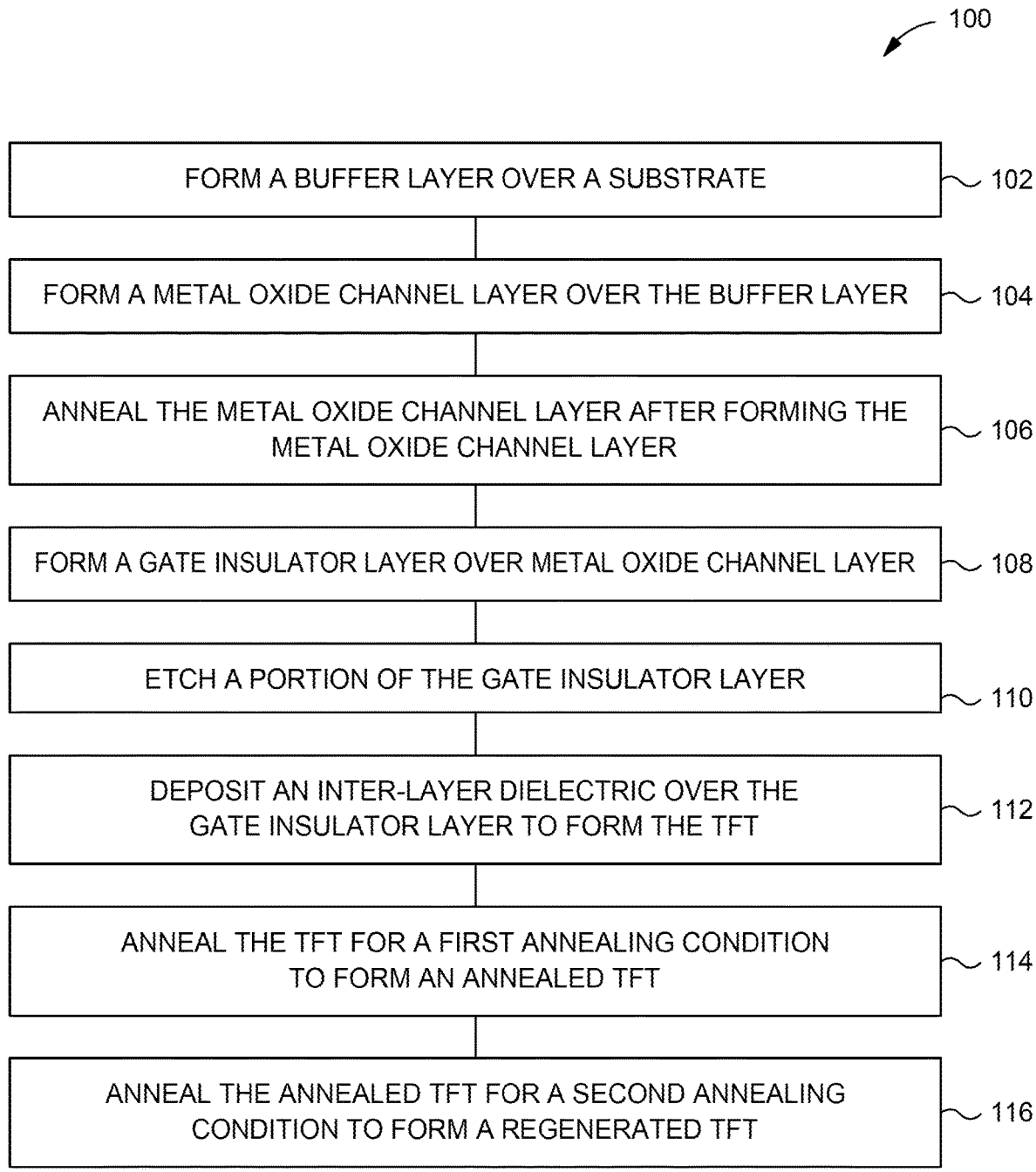
FIG. 1 depicts a process flow diagram of an example method of forming thin film transistor, according to some embodiments.

FIG. 1 depicts a process flow diagram of an example method 100 of forming thin film transistor, according to some embodiments. The method 100 includes forming a buffer layer over a substrate in activity 102. As used herein, the term "substrate" includes any suitable material, such as silicon based substrates, semiconductor based substrates, insulating based substrates, and germanium based substrates. In some embodiments, the substrate includes one or more layers present in a LTPO device. The substrate described herein can include a transparent material, such as rigid glass or flexible polyimides, or other materials useful for displays. In some embodiments, the buffer layer includes an insulating material, such as a silicon containing material, such as silicon nitride ($SiN_x$), silicon oxide ($SiO_x$), multi-layer silicon nitride/silicon oxide ($SiN_x/SiO_y$), silicon oxynitride (SiON), other insulating materials, or combination thereof. Any of the layer deposited herein can be deposited using conventional processes, such as chemical vapor deposition, such as plasma enhanced chemical vapor deposition.

The method 100 includes forming a metal oxide channel layer over the buffer layer in activity 104, and annealing the metal oxide channel layer after forming the metal oxide channel layer in activity 106. The metal oxide channel layer can include InGaZnO, InZnO, InSnO, InGaO, InGaSnO, InGaZnSnO, InGaZnON, ZnO, ZnON, ZnSnO, CdSnO, GaSnO, TiSnO, CuAlO, SrCuO, LaCuOS, GaN, InGaN, AlGaN, InGaAlN, or combinations thereof. In some embodiments, the metal oxide channel layer includes a single layer or a plurality of sublayers. In some embodiments, the metal oxide channel layer is annealed at a temperature of about 130° C. to about 500° C., such as about 140° C. to about 400° C. for about 5 minutes to about 60 minutes, such as about 10 minutes to about 20 minutes. In some embodiments, the channel layer is deposited to a thickness of about 300 Å to about 500 Å. In some embodiments, forming the metal oxide channel layer includes flowing a gas mixture at a pressure of about 0.1 Pa to about 0.8 Pa, such as about 0.2 Pa to about 0.5 Pa. The gas mixture including about 2% to about 80%, such as about 10% to about 50% oxygen gas by volume, such as about 20% to about 40% by volume.

A gate insulator layer is formed over the metal oxide channel layer in activity 108. The gate insulator layer can be formed at a thickness of about 1000 Å to about 2000 Å. The gate insulator layer can include insulating materials such as silicon oxide, silicon oxynitride, silicon nitride, or combinations thereof. In some embodiments, the gate insulator layer is formed by coflowing a silicon containing gas, such as silane and a nitrogen containing gas, such as nitrogen oxide. In some embodiments, such as for a 680 mm×880 mm substrate, the silicon containing gas is flowed at a rate of about 100 sccm to about 250 sccm, such as about 150 sccm to about 170 sccm and the nitrogen containing gas is flowed at a rate of about 5000 sccm to about 15000, such as about 10000 sccm.

The method includes etching a portion of the gate insulator layer in activity 110. In some embodiments, etching the portion of the gate insulator layer includes forming a gate over an inner portion of the gate insulator layer and exposing an outer portion of the gate insulator layer to a plasma, such as a helium containing plasma. The outer portion of the gate insulator layer is etched to expose portions of the channel layer. The portions of the channel layer is exposed to the plasma.

An inter-layer dielectric is deposited over the gate insulator layer to form the TFT in activity 112. The inter-layer dielectric can be a single layer of about 3000 Å to about 5000 Å. The TFT is annealed at a first annealing condition to form an annealed TFT in activity 114. The annealed TFT can be annealed at a second annealing condition to form a regenerated TFT in activity 116.

Figure 2:
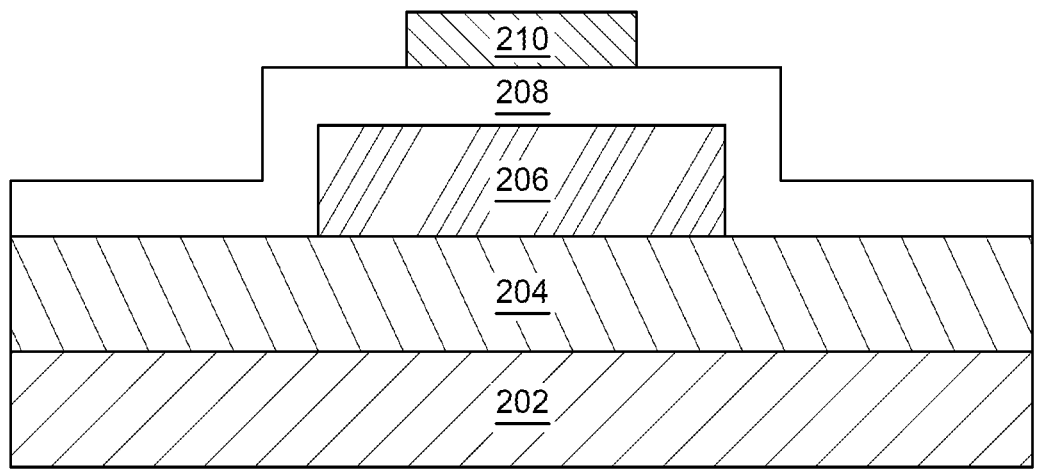
FIG. 2 depicts a schematic cross-sectional side view of a thin film transistor at a stage of fabrication, according to some embodiments.

FIG. 2 depicts a schematic cross-sectional side view of a thin film transistor at a stage of fabrication, according to some embodiments. The TFT of FIG. 2 can be formed using a method of forming TFTs, such as method 100. The TFT includes a substrate 202, a buffer layer disposed over the substrate 204, such as the buffer layer described in activity 102 of method 100, a channel layer 206, such as the channel layer described in activity 104 of method 100, a gate insulator layer 208, such as the gate insulator layer described in activity 106 of method 100, and a gate electrode 210 disposed over the gate insulator layer 208.

Figure 3:
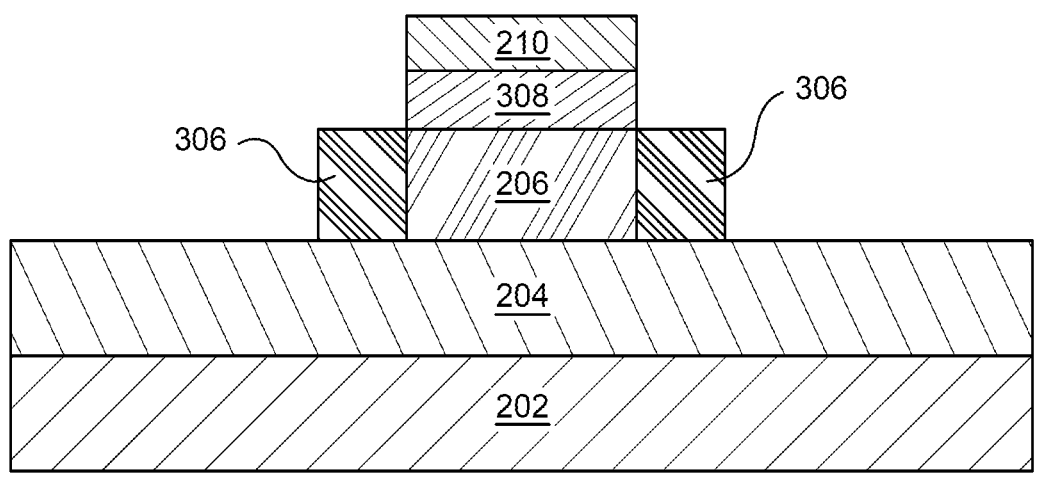
FIG. 3 depicts a schematic cross-sectional side view of a thin film transistor at a stage of fabrication after etching portions of a gate insulator layer, according to some embodiments.
Figure 4:
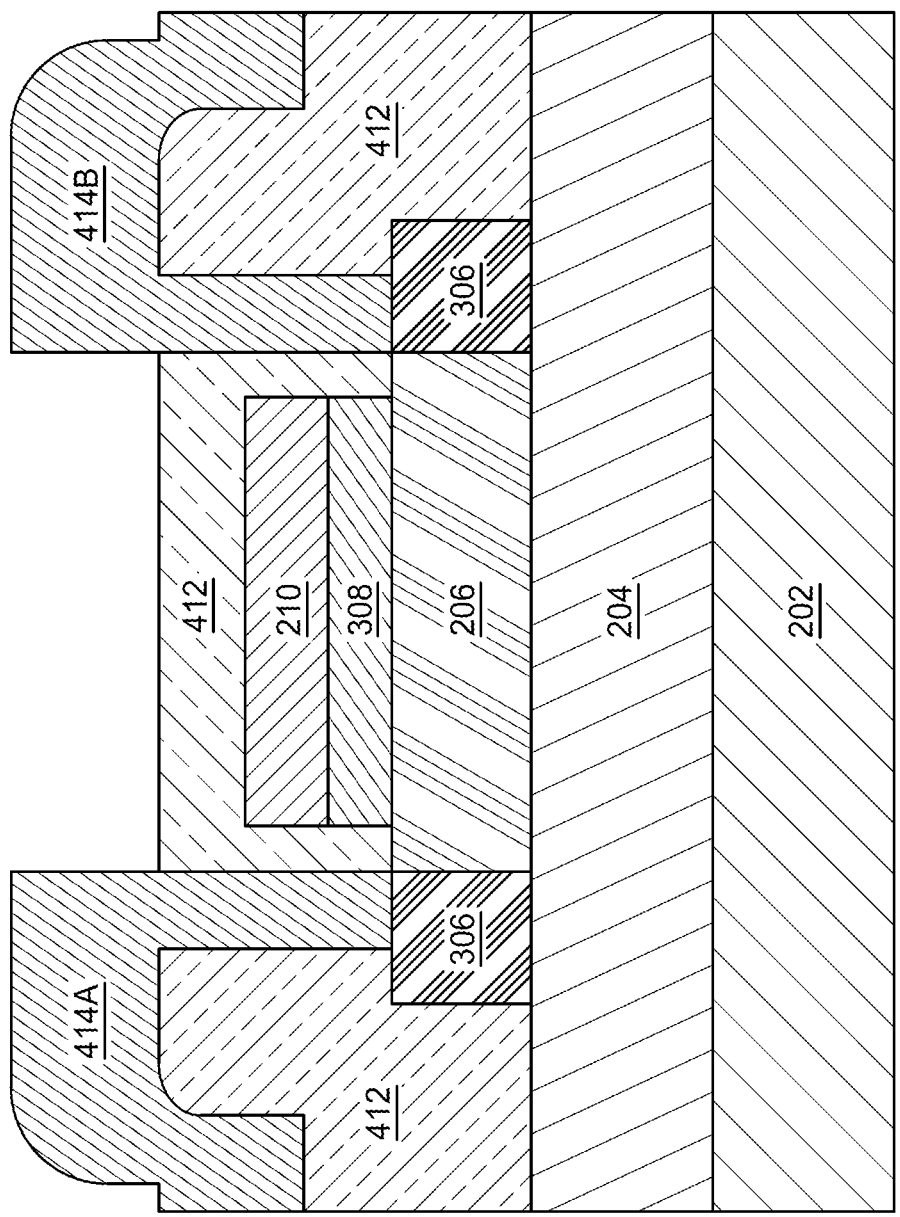
FIG. 4 depicts a schematic cross-sectional side view of a top gate thin film transistor, according to some embodiments.

FIG. 3 depicts a schematic cross-sectional side view of the TFT after a portion of the gate insulator layer 208 is etched, as described in activity 110 of method 100. The portion of the gate insulator layer 208 is etched to expose a portion 306 of the channel layer 206. As shown in FIG. 4, an inter-layer dielectric 412 is deposited over the gate electrode 210. A portion of the inter-layer dielectric 412 is etched to form a connection between the portion 306 of the channel layer and source and drain electrodes 414A, 414B. In some embodiments, the TFT depicted in FIG. 4 is considered a top gate TFT formed by a gate insulator cut integration process. In some embodiments, the as-deposited TFT includes an as-deposited threshold voltage (Vth) of about −5 V to about 20 V, such as about 0.5 V to about 2 V, such as about 1 V to about 1.5 V. In some embodiments, the as-deposited TFT includes an as-deposited electron mobility (p) of about 12 cm²/(V·s) to about 14 cm²/(V·s) and an as-deposited subthreshold slope (SS) of about 0.1 V/decade to about 0.6 V/decade, such as about 0.18 V/decade to about 0.25 V/decade.

After depositing the inter-layer dielectric 412, the TFT is annealed at a first annealing condition as described in activity 112 of method 100. In some embodiments, the first annealing condition includes a first temperature of about 250° C. or greater, such as about 260° C. to about 280° C. for a first duration of about 5 minutes to about 90 minutes, such as about 20 minutes to about 40 minutes. The first annealing condition includes annealing the TFT in the presence of nitrogen gas. After the first duration, the TFT threshold voltage decreases to less than the threshold voltage of the as-deposited TFT prior to the first annealing condition. In some embodiments, after the first duration, the TFT is electrically shorted or the threshold voltage is negative.

Subsequent to annealing the TFT at the first annealing condition, the annealed TFT is transferred to a furnace and heated to a second annealing condition, as described in activity 114 of method 100. The second annealing condition includes annealing the annealed TFT at a second temperature less than the first temperature. In some embodiments, the second annealing condition includes a temperature of about 275° C. or less, such as about 150° C. to about 260° C., such as about 250° C. The second annealing condition includes a second duration of about 30 minutes or greater, such as about 45 minutes to about 12 hours, such as about 60 minutes to about 180 minutes, such as about 90 minutes to about 120 minutes. The second annealing condition includes the presence of air, such as over 90% air by volume. In some embodiments, the second annealing condition includes a nitrogen-containing gas, an oxygen-containing gas, or combinations thereof. In some embodiments, the second annealing condition includes a vacuum condition. The regenerated TFT includes a threshold voltage greater than the threshold voltage of the annealed TFT, such as about −2.5 V to about 1 V, such as about −1 V to about 0.5 V. In some embodiments, the threshold voltage is about 0, such as within about 0.25 V of about 0. The regenerated TFT includes an electron mobility substantially the same as the as-deposited electron mobility, such as within about 10% of the as-deposited electron mobility, such as about 13 cm²/(V·s) to about 14 cm²/(V·s). The regenerated TFT includes a subthreshold slope substantially the same as the as-deposited subthreshold slope, such as within about 10% of the as-deposited subthreshold slope, such as about 0.1 V/decade to about 0.6 V/decade, such as about 0.18 V/decade to about 0.25 V/decade.

Ion Implantation Integration

Figure 5:
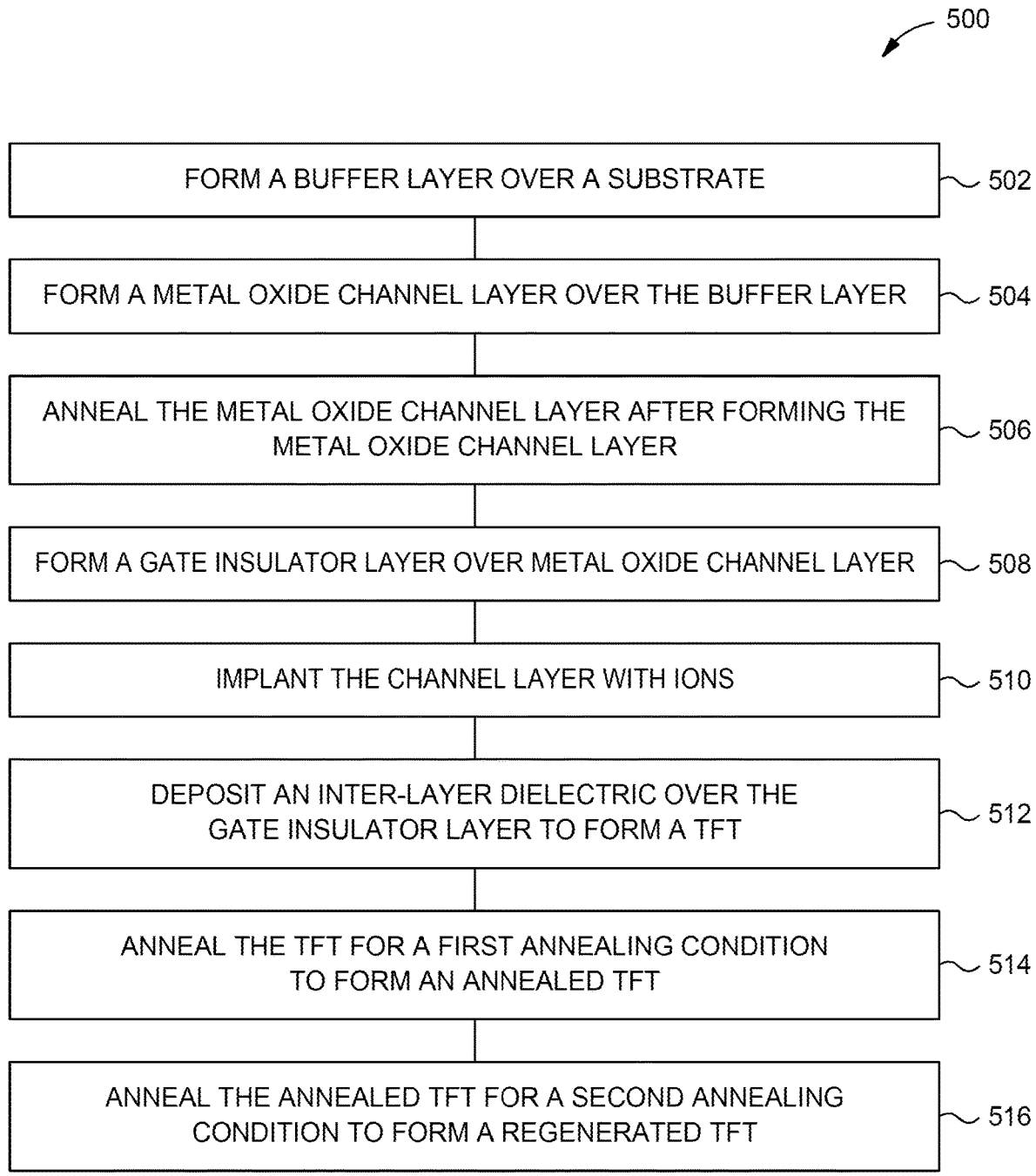
FIG. 5 depicts a schematic cross-sectional side view of a thin film transistor after an implantation process, according to some embodiments.

FIG. 5 depicts a process flow diagram of an example method 500 of forming thin film transistor using an ion implantation integration process, according to some embodiments. The method 500 includes forming a buffer layer over a substrate in activity 502. In some embodiments, forming the buffer layer in activity 502 is substantially the same as forming the buffer layer as described in activity 102 of method 100.

The method 500 includes forming a metal oxide channel layer over the buffer layer in activity 504, similar to activity 104 and annealing the metal oxide channel layer after forming the metal oxide channel layer in activity 506, similar to activity 106 of method 100. In some embodiments, the metal oxide channel layer is annealed at a temperature of about 300° C. to about 400° C., such as about 300° C. to about 350° C. for about 30 minutes to about 90 minutes, such as about 30 minutes to about 60 minutes. In some embodiments, the channel layer is deposited to a thickness of about 300 Å to about 500 Å. In some embodiments, forming the metal oxide channel layer includes flowing a gas mixture at a pressure of about 0.1 Pa to about 0.8 Pa, such as about 0.2 Pa to about 0.5 Pa. The gas mixture including about 2% to about 80%, such as about 10% to about 50% oxygen gas by volume, such as about 20% to about 40% by volume.

A gate insulator layer is formed over the metal oxide channel layer in activity 508, similar to activity 108 of method 100. The gate insulator layer can be formed at a thickness of about 1000 Å to about 2000 Å. The gate insulator layer can include insulating materials such as silicon oxide, silicon oxynitride, silicon nitride, or combinations thereof. In some embodiments, the gate insulator layer is formed by coflowing a silicon containing gas, such as silane and a nitrogen containing gas, such as nitrogen oxide. In some embodiments, such as for a 680 mm by 880 mm substrate, the silicon containing gas is flowed at a rate of about 100 sccm to about 250 sccm, such as about 150 sccm to about 170 sccm and the nitrogen containing gas is flowed at a rate of about 5000 sccm to about 15000, such as about 10000 sccm.

Figure 6:
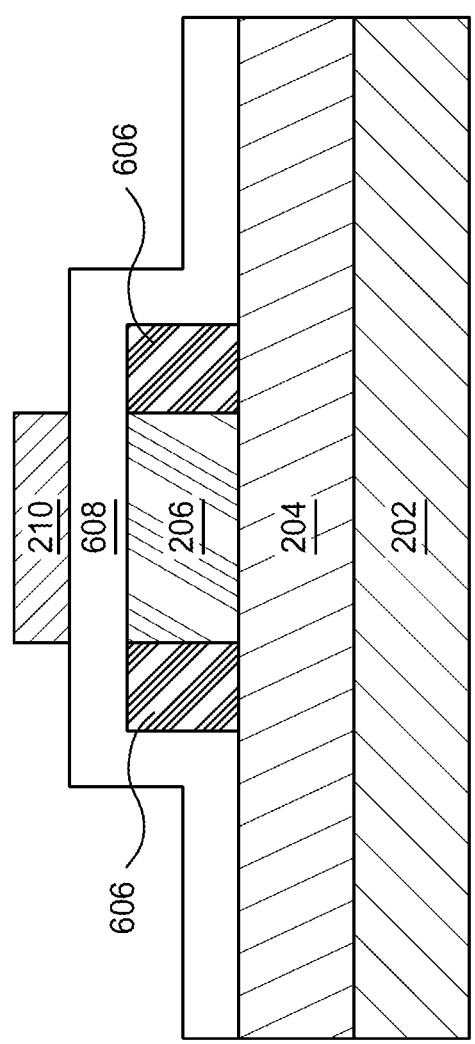
FIG. 6 depicts a schematic cross-sectional side view of a top gate thin film transistor, according to some embodiments.

The method 500 includes implanting the metal oxide channel layer with ions, such as boron ions in activity 510. In some embodiments, ions penetrate the gate insulator layer 608, as shown in FIG. 6, and implant into the metal oxide channel layer 606 after forming a gate electrode over the gate insulator layer. In some embodiments, prior to implantation, the gate insulator layer is annealed at a temperature of about 300° C. to about 360° C. for about 30 minutes to about 90 minutes, such as about 60 minutes.

An inter-layer dielectric is deposited over the gate insulator layer to form the TFT in activity 512. In some embodiments, the gate insulator layer is exposed to about ions at an implantation energy of about 20 keV to about 60 keV, such as about 30 keV to about 40 keV, with an implantation dose of about $10^{14}$ cm$^{-2}$ to about $10^{16}$ cm$^{-2}$. In some embodiments, the inter-layer dielectric is a single layer of about 500 Å to about 8000 Å, such as about 3000 Å to about 5000 Å. In some embodiments, the inter-layer dielectric includes multiple layers, such as a first sublayer of about 500 Å to about 3500 Å, such as about 1500 Å to about 3000 Å, a second sublayer of about 500 Å to about 3500 Å, such as about 1500 Å to about 3000 Å, and a third sublayer of about 500 Å to about 3500 Å, such as about 1000 Å to about 1500 Å. The TFT is annealed at a first annealing condition to form an annealed TFT in activity 514. The annealed TFT can be annealed at a second annealing condition to form a regenerated TFT in activity 516.

FIG. 6 depicts a schematic cross-sectional side view of a thin film transistor at a stage of fabrication, according to some embodiments. The TFT of FIG. 6 can be formed using a method of forming TFTs, such as method 500. The TFT includes a substrate 202, a buffer layer 204 disposed over the substrate 202, such as the buffer layer 204 described in activity 502 of method 500, a channel layer 206, such as the channel layer described in activity 504 of method 500, a gate insulator layer 608, such as the gate insulator layer described in activity 508 of method 500, and a gate electrode 210 disposed over the gate insulator layer 208. A portion 606 of the channel layer 206 includes ions implanted therein, such as boron ions.

Figure 7:
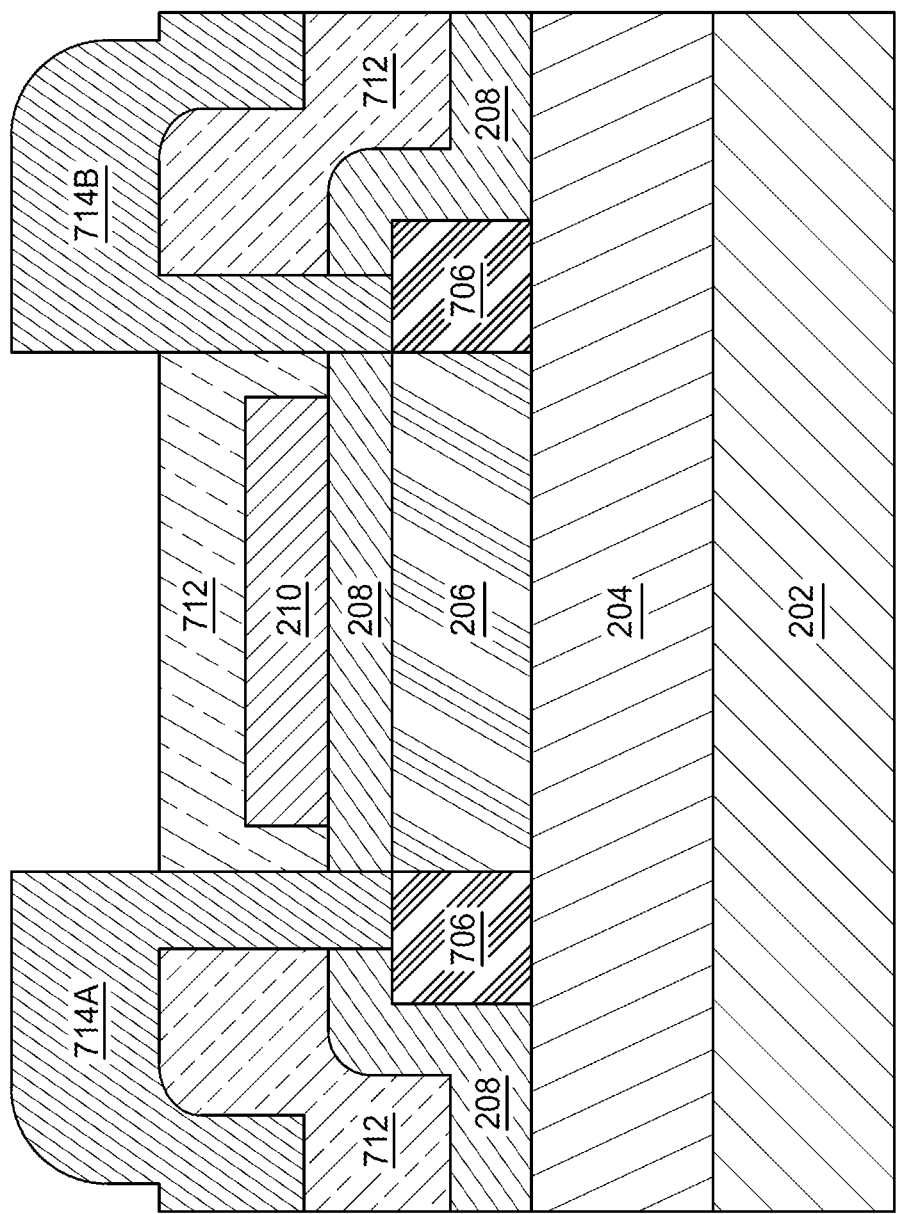
FIG. 7 depicts a schematic cross-sectional side view of the TFT after implantation, according to some embodiments.

FIG. 7 depicts a schematic cross-sectional side view of the TFT after implantation as described in method 500. The portion of the gate insulator layer 208 is etched to expose a portion 706 of the channel layer 206. As shown in FIG. 7, an inter-layer dielectric 712 is deposited over the gate electrode 210. A portion of the inter-layer dielectric 412 is etched to form a connection between the portion 706 of the channel layer and source and drain electrodes 714A, 714B. In some embodiments, the TFT depicted in FIG. 7 is considered a top gate TFT formed by an implantation integration process. In some embodiments, the as-deposited TFT includes an as-deposited threshold voltage of about −5 V to about 20 V, such as about −2.5 V to about 1 V, such as about −2.1 V to about −1 V for an implantation TFT without annealing the gate insulator layer, or about 0.25 V to about 0.6 V for TFTs formed by annealing the gate insulator layer. In some embodiments, the as-deposited TFT includes an as-deposited electron mobility of about 2.5 $cm^2/(V \cdot s)$ to about 15 $cm^2/(V \cdot s)$, such as about 3.0 $cm^2/(V \cdot s)$ to about 3.5 $cm^2/(V \cdot s)$, or about 12.0 $cm^2/(V \cdot s)$ to about 13.0 $cm^2/(V \cdot s)$. In some embodiments, the as-deposited subthreshold slope (SS) is about 0.1 V/decade to about 0.6 V/decade, such as about 0.15 V/decade to about 0.40 V/decade, such as about 0.18 V/decade to about 0.35 V/decade.

After depositing the inter-layer dielectric 712, the TFT is annealed at a first annealing condition as described in activity 514 of method 500. In some embodiments, such as for TFTs in which the gate insulator layer is not annealed, the first annealing condition includes a first temperature of about 250° C. or greater, such as about 300° C. to about 380° C. for a first duration of about 5 minutes to about 90 minutes, such as about 20 minutes to about 40 minutes. The first annealing condition includes annealing the TFT in the presence of nitrogen gas. After the first duration, the TFT threshold voltage decreases to a threshold voltage less than the threshold voltage of the as-deposited TFT. In some embodiments, after the first duration, the threshold voltage is less than zero, such as about −2 V or less, such as about −5 V or less, such as about −10 V or less. Alternatively, after the first duration, the TFT is electrically shorted.

Subsequent to annealing the TFT at the first annealing condition, in which the gate insulating layer is not annealed, the annealed TFT is transferred to a furnace and heated to a second annealing condition, as described in activity 516 of method 500. The second annealing condition includes annealing the annealed TFT at a second temperature less than the first temperature of the first annealing condition. In some embodiments, the second annealing condition includes a temperature of about 275° C. or less, such as about 225° C. to about 260° C., such as about 250° C. The second annealing condition includes a second duration of about 30 minutes or greater, such as about 45 minutes to about 12 hours, such as about 60 minutes to about 3 hours. In some embodiments, the second annealing condition includes the presence of air, such as over 90% air by volume. In some embodiments, the second annealing condition includes a nitrogen-containing gas, an oxygen-containing gas, or a combination thereof. In some embodiments, the second annealing condition includes vacuum conditions. The regenerated TFT includes a threshold voltage greater than the threshold voltage of the annealed TFT, such as about −2.5 V to about 1 V, such as about −1 V to about 0.5 V. In some embodiments, the threshold voltage is about 0, such as within about 0.25 V of about 0. The regenerated TFT includes an electron mobility substantially the same as the as-deposited electron mobility, such as within about 10% of the as-deposited electron mobility, such as about 12 $cm^2/(V \cdot s)$ to about 14 $cm^2/(V \cdot s)$. The regenerated TFT includes a subthreshold slope substantially the same as the as-deposited subthreshold slope, such as within about 10% of the as-deposited subthreshold slope, such as about 0.08 V/decade to about 0.25 V/decade.

In some embodiments, such as for TFTs in which the gate insulator layer is annealed, the first annealing condition includes a single temperature of about 300° C. or greater, such as about 320° C. to about 360° C. for a single duration of about 5 minutes to about 90 minutes, such as about 10 minutes to about 20 minutes. The first annealing condition includes annealing the TFT in the presence of nitrogen gas. After the single duration, the TFT is electrically shorted.

Subsequent to annealing the TFT at the first annealing condition, the annealed TFT is transferred to a furnace and heated to a second annealing condition, as described in activity 516 of method 500. The second annealing condition includes annealing the annealed TFT at a third temperature less than the first temperature, the second temperature, the single temperature or both. In some embodiments, the second annealing condition includes a temperature of about 275° C. or less, such as about 225° C. to about 260° C., such as about 250° C. The second annealing condition includes a duration of about 30 minutes or greater, such as about 45 minutes to about 12 hours, such as about 1 hour to about 3 hours, such as about 60 minutes to about 90 minutes. In some embodiments, the second annealing condition includes the presence of air, such as over 90% air by volume. In some embodiments, the second annealing condition includes vacuum conditions. The regenerated TFT includes a threshold voltage greater than the threshold voltage of the annealed TFT, such as about −2 V to about 0.5 V, such as about −1 V to about 0 V. In some embodiments, the threshold voltage is about 0, such as within about 0.5 V of about 0. The regenerated TFT includes an electron mobility substantially the same as the as-deposited electron mobility, such as within about 10% of the as-deposited electron mobility, such as about 13 $cm^2/(V \cdot s)$ to about 15 $cm^2/(V \cdot s)$. The regenerated TFT includes a subthreshold slope substantially the same as the as-deposited subthreshold slope, such as within about 10% of the as-deposited subthreshold slope, such as about 0.1 V/decade to about 0.3 V/decade.

EXAMPLES

Several samples were formed for each of the integration processes described in Table 1.

TABLE 1

| | | | Integration Details | | | |
|---|---|---|---|---|---|---|
| Type | IGZO pO$_2$ | IGZO Anneal Conditions | Gate Insulator Anneal Conditions | Implantation | ILD Thickness | ILD anneal |
| B1 | 20% | 350° C. for 1 hr | None | None | 4000 Å | 300° C. for 15 mins |
| B2 | 20% | 350° C. for 1 hr | None | 30 KeV 1E15 | 4000 Å | 300° C. for 15 mins |
| B3 | 50% | 141° C. for 10 min | 330° C. for 1 hr | 30 KeV 1E15 | 2000 Å/ 2000 Å/ 1000 Å | 340° C. for 15 mins |

Each of the integration types B1, B2, and B3 were formed by depositing a silicon nitride layer over the substrate at a thickness of about 1000 Å. A silicon oxide layer was formed over the silicon nitride layer at a thickness of about 3000 Å. Integration type B1 and B2 substrates further included an IGZO channel layer deposited at a pressure of 0.2 Pa at a thickness of about 400 Å. Integration type B3 substrates further included an IGZO channel layer deposited at a pressure of about 0.4 Pa. For each of the integration types B1, B2, and B3, depositing the channel layer included exposing the substrate to a gas mixture including argon, oxygen, or combination thereof. In some embodiments, one or more target materials are sputtered by the oxygen or argon in the gas mixture. In some embodiments, the target materials to be sputtered include indium, gallium, zirconium, and combinations thereof. For integration types B1 and B2, the mixture included about 20% oxygen by volume. For integration type B3, the mixture included about 50% oxygen by volume. For integration types B1 and B2, the IGZO channel layer was annealed at about 350° C. for 1 hr. For integration type B3, the IGZO channel layer was annealed at about 141° C. for 10 minutes. For each of B1, B2, and B3, the gate insulator layer was deposited over the IGZO layer at a temperature of about 270° C. to about 280° C. The gate insulator layer was deposited to a thickness of about 1500 Å. Depositing the gate insulator included coflowing silane and dinitrogen oxide. The gate insulator was annealed at about 330° C. for 1 hour for B3. For integration types B2 and B3, the samples were exposed to boron ion implantation as described in method 500. For integration type B1, the samples were formed using the gate insulator cut integration process described in method 100. Samples formed using integration types B1 and B2 included an inter-layer dielectric having a thickness of 4000 Å. Samples formed using integration B3 included three sublayers having thicknesses of about 2000 Å (e.g., SiO sublayer), 2000 Å (e.g., SiO sublayer), and 1000 Å (e.g., SiN sublayer).

TABLE 2

Properties Before and After Regenerative Anneal

| Type | As deposited Properties | Post ILD Anneal Properties | Regenerative Anneal Conditions | Post Regenerative Anneal Properties |
|---|---|---|---|---|
| B1 | Vth = 1.19; μ = 13.01; SS = 0.20 | Shorted | 250° C. for 2 hrs | Vth = 0.02; μ = 13.44; SS = 0.21 |
| B2 | Vth = 0.55; μ = 12.88; SS = 0.18 | Vth = −11.44; μ = 11.17; SS = 0.18 | 250° C. for 1 hr | Vth = 0.11; μ = 13.20; SS = 0.12 |
| B3 | Vth = −2.09; μ = 3.19; SS = 0.34 | Shorted | 250° C. for 1 hr | Vth = −0.46; μ = 13.96; SS = 0.19 |

The threshold voltage, electron mobility, and subthreshold voltage values for substrates formed using integration type B1 prior to ILD annealing are summarized in Table 2. The substrates formed using integration type B1 after ILD annealing for 15 minutes at a temperature of about 300° C. shorted. The shorted TFTs were then annealed at a lower temperature of about 250° C. in the presence of air for about an hour. The TFTs were regenerated having a negative threshold voltage. The TFTs were further annealed for an additional hour and the threshold voltage was increased to close to zero.

Threshold voltage values for substrates formed using integration type B2 as-deposited and prior to ILD annealing are summarized in Table 2. The current, gate voltage values of sample TFTs after ILD annealing at 275° C. for about 30 minutes in the presence of a nitrogen containing gas are also summarized in Table 2. As compared to the samples prior to annealing, the threshold voltage values were shifted to a more negative threshold voltage for annealed substrates. The highly conductive TFTs were unusable for the TFTs' intended purpose. Typically TFTs that are shorted or are highly conductive are discarded as unusable. The highly conductive TFTs were then annealed at a lower temperature of about 250° C. in the presence of air for about an hour and the threshold voltage was shown to be regenerated to close to zero as shown in Table 2.

Threshold voltage values for substrates formed using integration type B3 as-deposited and prior to ILD annealing are summarized in Table 2. The threshold voltage, electron mobility, and subthreshold voltage are summarized in Table 2. The TFTs were ILD annealed at 340° C. for about 15 minutes in the presence of a nitrogen containing gas and were shorted. The shorted TFTs were then annealed at a lower temperature of about 250° C. in the presence of air for about an hour as shown in Table 2. The TFTs were regenerated having a threshold voltage close to zero.

As demonstrated by the examples, it has been discovered that the low temperature annealing method described herein is effective for a wide variety of TFTs irrespective of how the TFT is integrated. Furthermore, the annealing method described herein demonstrated higher threshold voltage uniformity across several samples of TFTs formed using the same process in comparison to the threshold voltage uniformity of the TFTs prior to the low temperature annealing. In particular, a bias temperature stress test can be performed on as-deposited TFTs prior to regeneration showed more variation between the TFTs integrated using the same integration process. The same bias temperature stress test can be performed on regenerated TFTs. The regenerated TFTs processed using any of the methods described herein, demonstrate less variation, and more stability than the as-deposited TFTs. A stability test can include applying a gate voltage to the gate electrode of the TFT, such as a voltage of about 10 V to about 30 V. The TFT can be heated to about 50° C. to about 70° C. for a predetermined duration, such as about 300 s, 600 s, 900 s, 1800 s, or 3600 s, to see if the TFT transfer curve moves for one or more of the predetermined durations, such as each of the durations 300 s, 600 s, 900 s, 1800 s, and 3600 s. Minor movement demonstrates stability and more movement demonstrates less stability. It is possible to test the TFTs using both negative and positive voltage.

What is claimed is:

1. A method of forming a thin film transistor (TFT) comprising:
    forming a buffer layer over a substrate;
    forming a metal oxide channel layer over the buffer layer;
    annealing the metal oxide channel layer;
    forming a gate insulator layer over the metal oxide channel layer;
    forming a gate electrode over the gate insulator layer;
    depositing an inter-layer dielectric (ILD) over the gate electrode and the gate insulator layer to form the TFT; then
    annealing the TFT for a first annealing condition to form an annealed TFT, wherein the annealed TFT is shorted or comprises a first threshold voltage, the annealed TFT having exposed source and drain electrodes; then
    annealing the annealed TFT having exposed source and drain electrodes for a second annealing condition to form a regenerated TFT having a second threshold voltage greater than the first threshold voltage, the second annealing condition comprising a temperature of 150° C. to 275° C.

2. The method of claim 1, further comprising annealing the gate insulator layer at a temperature of 200° C. to 350° C. for 60 minutes to 120 minutes.

3. The method of claim 1, wherein the first annealing condition comprises annealing in the presence of a nitrogen-containing gas.

4. The method of claim 1, wherein forming the metal oxide channel layer comprises flowing a gas mixture at a pressure of 0.1 Pa to 0.8 Pa, the gas mixture comprising 2% to 80% oxygen gas by volume.

5. The method of claim 1, wherein the metal oxide channel layer is selected from indium gallium zinc oxide (IGZO), InGaZnON, ZnO, ZnON, ZnSnO, CdSnO, GaSnO, TiSnO, CuAlO, SrCuO, LaCuOS, GaN, InGaN, AlGaN, InGaAlN, or combinations thereof.

6. The method of claim 1, wherein the buffer layer comprises silicon nitride, silicon oxide, or a combination thereof.

7. The method of claim 1, wherein the first annealing condition comprises annealing the TFT at a temperature of 250° C. or greater for a first duration.

8. The method of claim 1, wherein the second annealing condition comprises annealing for 30 mins to 12 hours.

9. The method of claim 1, further comprising doping the metal oxide channel layer with ions.

10. A method of processing a TFT comprising:
   annealing the TFT for a first annealing condition to form an annealed TFT having a first threshold voltage and exposed source and drain electrodes, the TFT comprising a silicon-containing buffer layer, a metal oxide channel layer, a gate insulator layer, and an inter-layer dielectric (ILD); and
   annealing the annealed TFT having exposed source and drain electrodes for a second annealing condition to form a regenerated TFT having a second threshold voltage greater than the first threshold voltage, the second annealing condition comprising a temperature of 150° C. to 275° C.

11. The method of claim 10, wherein the annealed TFT at the first threshold voltage is at 0 volt or less or is electrically shorted.

12. The method of claim 10, wherein the first annealing condition comprises annealing the TFT at a temperature of 250° C. or greater.

13. A method of processing a TFT comprising:
   annealing the TFT for a first annealing condition to form an annealed TFT having a first threshold voltage, the TFT comprising a silicon-containing buffer layer, a metal oxide channel layer, a gate insulator layer, and an inter-layer dielectric (ILD); and
   annealing the annealed TFT for a second annealing condition to form a regenerated TFT having a second threshold voltage greater than the first threshold voltage, wherein the second threshold voltage of the regenerated TFT is 0 V or greater, the second annealing condition comprising a temperature of 150° C. to 275° C.

14. The method of claim 10, wherein an electron mobility of the regenerated TFT is equal to or greater than an electron mobility of the TFT before annealing.

15. The method of claim 1, wherein the second threshold voltage of the regenerated TFT is 0 V or greater.

* * * * *